United States Patent [19]
Moretti et al.

[11] Patent Number: 5,222,655
[45] Date of Patent: Jun. 29, 1993

[54] SOLDERING METHOD EMPLOYING PROVISION OF HEATED GAS TO A SOLDERING ALLOY AT A SOLDERING CONNECTION

[75] Inventors: Sergio Moretti; Ugo Fracassi, both of Rome, Italy

[73] Assignee: Selenia Industrie Elettroniche Associate, Rome, Italy

[21] Appl. No.: 677,628

[22] Filed: Mar. 28, 1991

[30] Foreign Application Priority Data

Mar. 28, 1990 [IT] Italy ................... 47801 A/90

[51] Int. Cl.$^5$ .................... B23K 3/04; H01L 21/58
[52] U.S. Cl. ........................ 228/230; 228/242
[58] Field of Search ........... 228/6.2, 230, 232, 180.2, 228/229, 228, 242; 219/85.17, 85.1

[56] References Cited

U.S. PATENT DOCUMENTS

| | | | |
|---|---|---|---|
| 3,964,664 | 6/1976 | Butler et al. | 228/6.2 |
| 4,426,571 | 1/1984 | Beck | 228/242 |
| 4,799,615 | 1/1989 | Davenport | 228/44.7 |
| 4,799,617 | 1/1989 | Friedman | 228/44.7 X |

*Primary Examiner*—Kenneth J. Ramsey
*Attorney, Agent, or Firm*—Cohen, Pontani, Lieberman, Pavane

[57] ABSTRACT

An apparatus for applying a soldering alloy to an element to be soldered including an open-channeled member having a receiving region for holding the element, a vacuum system connected to the member for creating a negative pressure through the open channel and at the receiving region sufficient to retain the element against the receiving region, a heating coil connected to the member for conducting heat to the element at a soldering temperature, and a gas distribution and heating system for providing heated gas to a soldering alloy at a temperature sufficient to melt and provide at least one soldering connection on the heated element. The invention also comprises a method for providing heat to an element to be soldered substantially by conduction and heat to a soldering alloy substantially by convection employing a heated gas all at temperatures sufficient to provide a soldered connection without damaging the element being soldered.

1 Claim, 1 Drawing Sheet

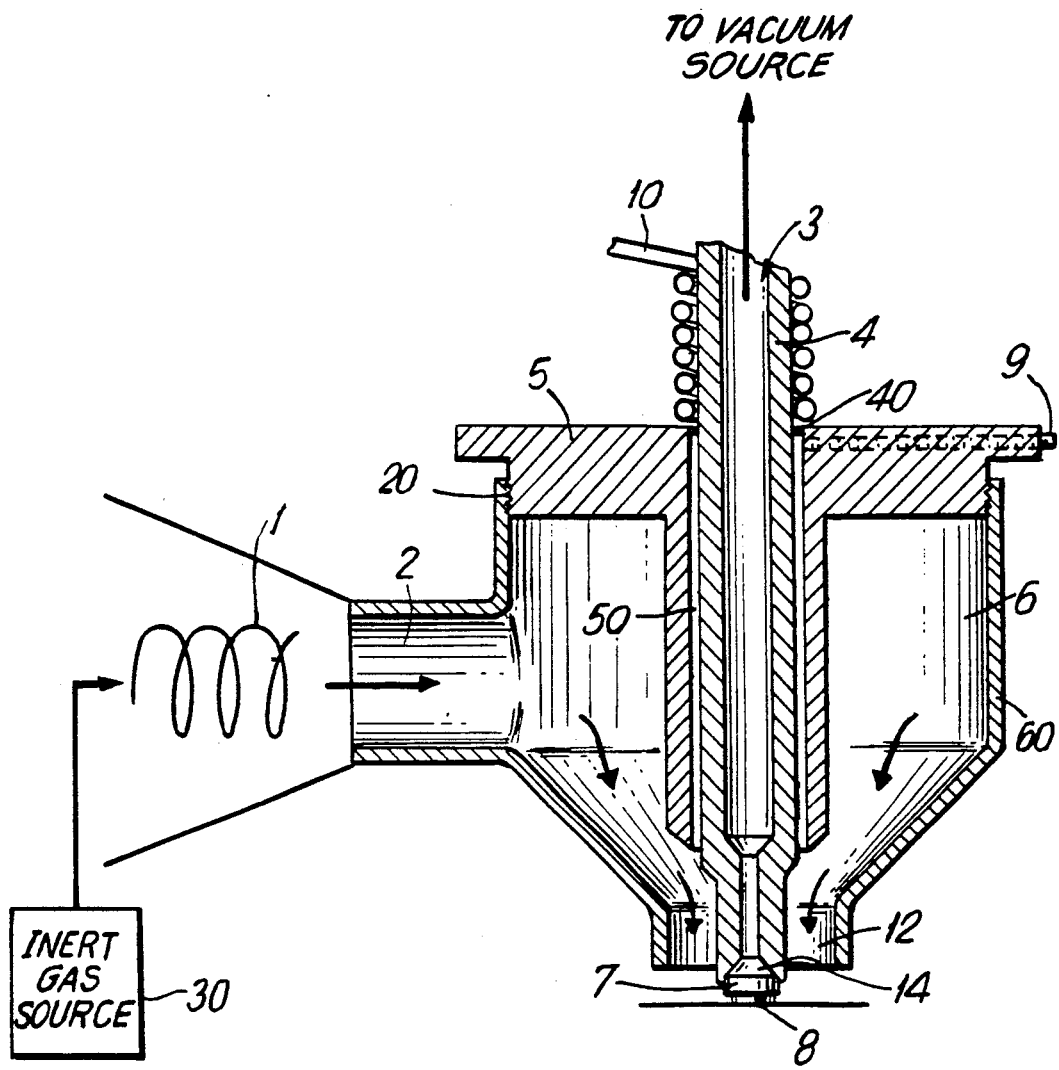

SOLDERING METHOD EMPLOYING PROVISION OF HEATED GAS TO A SOLDERING ALLOY AT A SOLDERING CONNECTION

FIELD OF THE INVENTION

The present invention relates to a soldering apparatus and method particularly applicable to microelectronics involving the soldering of microelectronic devices with soldering alloys for the assembly of circuits and microwave components. More particularly, the present invention relates to an apparatus and method for providing heat to both a soldering alloy and an element to be soldered, preferably on or to a chip, where heat is provided to the element by conduction and to the alloy by convection utilizing a heated gas shot through a gas jet to melt the alloy homogeneously and uniformly.

BACKGROUND OF THE INVENTION

Soldering involves heating the surfaces to be soldered to a sufficient temperature, and melting the solder to a sufficient temperature, such that the molten solder flows and adheres to the surfaces and thereby enables physical attachment and electrical connection. In microelectronics, it is imperative that the heating temperatures are well controlled to prevent damage to the elements, while also ensuring sufficient soldering adhesion.

Previous solutions to microelectronic soldering of chips onto microcircuits have revealed a number of drawbacks. In particular, during soldering, oxidization of the alloy occurs as a result of air becoming entrained within the inert flow. Likewise, typical systems require an operator's devoted attention to and involvement in the procedures and conditions of soldering, while carrying out the soldering operation. Likewise, the operations are tied to different melting temperatures. Such prior art solutions also fail to ensure the homogeneity and uniformity of the soldering connection.

Accordingly, it is an object of the present invention to provide a method and apparatus that eliminates the problems of oxidation inherent in entrained air present in many existing soldering operations.

It is a further object of the instant invention to provide a method and apparatus that utilize the benefits of both conduction and convection required to heat the surfaces to be soldered and to melt the solder.

It is yet a further object of the instant invention to provide a method and apparatus that allows more than one soldering at a time, and repetitive soldering.

It is a further object of the instant invention to provide a method and apparatus for soldering that is easily automatable.

SUMMARY OF THE INVENTION

The foregoing objects, and other objects of the instant invention are achieved by the provision of an apparatus for applying a soldering alloy to an element to be soldered comprising an open-channeled member having a receiving region for holding the element, vacuum means connected to the member for creating a negative pressure through the open channel and at the receiving region sufficient to retain the element against the receiving region, heating means connected to the member for conducting heat to the element at a soldering temperature, and gas distribution and heating means for providing heated gas to a soldering alloy at a temperature sufficient to melt and provide at least one soldering connection on the heated element.

The invention also comprises a method for providing heat to an element to be soldered substantially by conduction and heat to a soldering alloy substantially by convection employing a heated gas all at temperatures sufficient to provide a soldered convection without damaging the element.

Under a preferred embodiment, the gas distribution and heating means includes a heated gas jet forced through a nozzle structured to form a flow of gas in the shape of a ring.

It is thus a feature of the instant invention that oxidation of the solder during soldering is minimized or substantially eliminated by the use of gas distribution and heating means that prevents entrained air from reaching the solder.

It is a further feature of the instant invention that a separate heat source is provided for heating the element to be soldered by conduction.

It is still a further feature of the instant invention that uniform pressure of heated gas is provided at the point of attachment on the element and to the soldering alloy thereby exploiting the rules governing gas flow and preventing the formation of irregularities in the soldering connection.

It is still a further feature of the instant invention that a method for soldering involves both conduction and convection thereby improving the resultant soldered connection.

It is yet a still further feature of the instant invention to provide for repetitive soldering and multiple, simultaneous soldering, that is easily automatable.

BRIEF DESCRIPTION OF THE DRAWINGS

Other objects and many of the attendant advantages and features of the present invention will be readily appreciated and better understood by reference to, and through consideration of the detailed description of the invention together with the accompanying drawing wherein:

The sale view of the drawing is a cross-sectional view of a soldering apparatus in accordance with a preferred embodiment of the instant invention.

DETAILED DESCRIPTION OF THE INVENTION

FIG. 1 shows a cross-sectional view of the preferred embodiment of the instant invention which, as further explained herein, makes use of both conduction and convection to achieve a soldered connection. In particular, gas enters an annular chamber 6 from an external source, supplied through gas nozzle 2, to provide gas at a pressure within the chamber 6 formed within walls 60. The gas (or gasses) that are employed are those having a sufficient heat retention to remain sufficiently hot as they escape through an annular-ringed aperture 12 to enable melting of a soldering alloy 8 positioned under an element or chip 7 to be soldered. Likewise, the gass(es) employed are inert to prevent chemical interaction with the materials.

At the top of the annular chamber 6 is a flow regulation support 5 which can be mounted within the chamber 6 in a screw-threaded manner to enable tightening, or loosening, to change the size of chamber 6.

A thermoresistor 1 for heating the gas to a temperature sufficient to enable soldering is shown disposed upstream from the gas nozzle 2. However, it is understood that thermoresistor 1 can be positioned in any of a number of regions to ensure thermal control, including within the annular chamber 6, or even within the annular aperture 12, without departing from the scope of the instant invention.

The inert gas input system, comprising the thermoresistor 1, gas nozzle 2 and aperture 12 protects the solder from oxidizing, as it prevents air from becoming entrained or contacting the solder during operation. Similar systems can be found in electric arc welders, but not for use in performing soldering by means of hot gasses. Likewise, any of a number of known soldering alloys 8 can be used, depending upon the application.

Disposed within the annular chamber 6 is a channelled member 3 having an open channel running its length, and formed by walls 4. At the lower portion of walls 4 is a receiving region 14 with an aperture therebetween into which element 7 can be inserted. Attached to member 3 is a vacuum pump or other suitable device used for creating negative pressure at the point of contact between receiving region 14 and element 7 to enable element 7 to be seated against the lower portion of the member 3 and against or within receiving region 14, retained in place by suction.

Heat is provided to the element 7 to enable soldering by, among other things, conduction. That is, the element 7 is placed against and in contact with the walls 4 at the retaining region 14. A heater element 10 is positioned around, or otherwise in contact with the upper portion of walls 4. Walls 4 are made of a suitable material to enable transfer by conduction of heat to the retaining region. At the retaining region, heat is supplied to the element 7. The heating element 10 may be positioned anywhere along walls 4, and even within the chamber 6, to provide heat. However, it is preferred that the heating element 10 be positioned outside of the chamber 6 to prevent, among other things, any possibility of interference with the gasses within the chamber (chemical and/or by heating).

The walls 4 of member 3 are also positioned within the chamber 6 to enable heat transfer from and to the gas contained in the chamber 6 during operation, and to enable heat stabilization of the system. The entire walled suction channeled member 3 is movably mounted within the annular chamber 6, through an aperture 50 in the flow regulation support 5 so that it can be moved upwardly or downwardly to enable proper positioning in use. A gasket 40 can be placed around the member 3 at the junction of member 3 with support 5 to prevent escape of gas therethrough. A fixing screw 9 passes longitudinally through the support 5 for screwable engagement with walls 4 to provide a retaining means for the member 3, after its position is determined and set.

In operation, the assembly is moved into position and the member 3 is placed over the workpiece. The fixing screw 9 is adjusted to retain the member 3 in this position. A suction is applied to member 3, and the element 7 to be soldered is adhered by the negative pressure to the retaining region along wall 4 of member 3. A soldering alloy 8 is positioned against the element to be soldered, at the proper soldering location. Heater element 10 is engaged, and heat passes by conduction along the walls 4 to the retaining region and then to the element 7. Thereafter, thermoresistor 1 heats an inert gas to a sufficient temperature, and the heated gas in injected through nozzle 2 into the annular chamber 6 and begins to exit through the annular aperture 12. The heated gas contacts the soldering alloy 8 and, essentially by conduction, heats the alloy to a melting temperature, whereupon soldering is achieved.

The temperatures selected for the conduction and convection heating are arrived at by determining the proper temperatures to be established at the point of soldering, and then determining the extent of loss (or cooperative gain) as a result of the design of the apparatus.

It is further understood that a number of the devices described above and shown in the drawing can be attached in series, sharing the same gas and power sources while abutting one another to enable the soldering of many elements, simultaneously. Likewise, a single, or multiplicity of such assemblies can be interfaced with a computer control system to provide for synchronized, or systematic application and use.

Accordingly, while there have been shown, described and pointed out the fundamental novel features of the invention as applied to preferred embodiments thereof, it will be understood that various omissions, substitutions and changes in the form and details of the apparatus illustrated and in its operation and method described, may be made by those skilled in the art without departing from the spirit of the invention. It is the intention, therefore, to be limited only as indicated by the scope of the claims appended hereto.

We claim:

1. A method of soldering an element by means of a soldering alloy, the element having first and second sides, the method comprising:
   applying the soldering alloy to the first side of the element;
   contacting the second side of the element with an end of a holding member having an open channel;
   applying a vacuum to the open channel for retaining the element against the end of the holding member;
   heating the holding member by contacting at least a portion of the holding element with a heated heating element; and
   conducting a flow of heated inert gas into an annular chamber having an annular opening and surrounding the holding member, and further conducting the heated inert gas through an annular opening of the annular chamber, wherein the annular opening is disposed at the end of the holding member retaining the element, such that the flow of heated inert gas through the annular opening is directed against the element.

* * * * *